United States Patent
Templeton et al.

(10) Patent No.: US 6,365,945 B1
(45) Date of Patent: Apr. 2, 2002

(54) SUBMICRON SEMICONDUCTOR DEVICE HAVING A SELF-ALIGNED CHANNEL STOP REGION AND A METHOD FOR FABRICATING THE SEMICONDUCTOR DEVICE USING A TRIM AND ETCH

(75) Inventors: Michael K. Templeton, Atherton; Masaaki Higashitani, Sunnyvale; John Jianshi Wang, San Jose, all of CA (US)

(73) Assignee: Advance Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/563,024

(22) Filed: May 2, 2000

Related U.S. Application Data

(60) Provisional application No. 60/169,185, filed on Dec. 6, 1999.

(51) Int. Cl.$^7$ ............................................... H01L 29/76
(52) U.S. Cl. ................ 257/395; 257/394; 257/396; 257/397; 257/398; 257/399; 257/400; 257/224; 257/243
(58) Field of Search ............................ 257/243, 224, 257/394–400

(56) References Cited

U.S. PATENT DOCUMENTS 6,060,372 A * 5/2000 Smayling et al. ............ 257/389
6,096,602 A * 8/2000 Kim et al. ................... 438/257

OTHER PUBLICATIONS

"Silicon Processing for the VLSI ERA," vol. 2—Processing Integration (1990); S. Wolf; pp. 327–331, 428–433.

\* cited by examiner

*Primary Examiner*—Fetsum Abraham
(74) *Attorney, Agent, or Firm*—Sawyer Law Group LLP

(57) ABSTRACT

A submicron semiconductor device having a self-aligned channel stop implant region, and a method for fabricating the semiconductor device using a trim and etch is disclosed. The semiconductor device includes a plurality of active regions separated by insulating regions. The method for fabricating the device includes depositing a nitride over a substrate and selectively covering the active regions with a mask, wherein the mask extends beyond boundaries of the active regions to narrow the width of the insulating regions. Thereafter, a channel stop implant is performed to form channel stops. The mask is then trimmed to the boundaries of the active regions after formation of the channel stops, followed by etching the nitride in exposed areas of the mask. Field oxide is then grown in the insulating regions, whereby the field oxide is self-aligned to the channel stops.

3 Claims, 3 Drawing Sheets

SUBMICRON SEMICONDUCTOR DEVICE HAVING A SELF-ALIGNED CHANNEL STOP REGION AND A METHOD FOR FABRICATING THE SEMICONDUCTOR DEVICE USING A TRIM AND ETCH

This application claim benefit to provisional application 60/169,185 filed Dec. 6, 1999.

FIELD OF THE INVENTION

The present invention relates to fabricating submicron semiconductor devices, and more particularly to fabricating a submicron semiconductor device having a self-aligned channel stop region using a trim and etch method.

BACKGROUND OF THE INVENTION

During the manufacturing of integrated circuit devices, the devices are isolated from one another through a combination of a thick field oxide (FOX) and channel doping. The area required for the isolation region is a limitation to high packing density. The isolation spacing required is due in part to the process used to fabricate the devices.

As device geometry decreases past submicron size, conventional fabrication processes reach the limit of their effectiveness. For example, compare a conventional process flow that might be used to fabricate a CMOS (complementary metal oxide) circuit having a feature of size 1.25–2 microns with a conventional process that might be used for a circuit having a feature of size 0.8 microns.

The process for fabricating the 1.25–2 micron device begins by covering the substrate with a thin layer of nitride in a pattern that defines active device and FOX regions. Thereafter, the substrate in the field regions is selectively implanted with a channel stop dopant, such as boron, during a channel stop implant process. The field oxide is then grown during a LOCOS (LOCal Oxidation of Silicon) process to form the FOX regions. During this process, the channel stops are self-aligned to the FOX regions. The nitride layer is then removed from the active regions, and a gate oxide is grown followed by a deposition of polysilicon for the gate layer.

Performing the LOCOS process after the channel implant causes thermal diffusion of the dopant towards the active areas due to the growth of the FOX regions. Because the devices are so large, however, the amount of thermal diffusion is relatively small when compared to the spacing between the devices. Consequently, the diffusion caused during this process does not negatively affect such large devices. The process is inappropriate, however, for smaller devices because due to denser spacing of smaller devices, the dopant from the FOX regions encroaches the active areas and comprises the devices.

FIGS. 1A–1C are cross sectional views a substrate showing an improved process flow that might be used to fabricate a CMOS circuit having a feature of size of approximately 0.8 microns, for example. First, a layer of nitride 10 is deposited on a substrate 12 and then etched such that the nitride 10 remains only over the active regions, as shown in FIG. 1A. FIG. 1B shows that a thermal-oxidation step is then performed to grow the field oxide (FOX) regions 14 between the active regions. FIG. 1C shows that after the FOX regions 14 are grown, the nitride 10 is selectively removed and a photo resist is patterned over the remaining nitride layers to act as a mask 16 for a channel stop implant process, shown by the arrows.

Although this process is an improvement over older techniques, it suffers from lithographic resist tolerance limitations. To provide proper channel widths between the active areas, a relatively thick resist mask must be used that must be patterned with tolerances on the order of 140 nanometers or 0.14 microns. To prevent encroachment of the oxide and the dopant to the closely spaced nitride layers over the active areas, the resist can only be misaligned from the nitride layers by plus or minus approximately 100 nanometers, or 0.1 microns. Patterning such a thick layer of resist at such exacting tolerances is extremely difficult. Furthermore, in this process, the FOX regions and the channel stops are not self-aligned.

Accordingly, what is needed is an improved isolation process that is suitable for semiconductor devices having feature sizes of approximately 0.3 microns. The present invention addresses such a need.

SUMMARY OF THE INVENTION

A submicron semiconductor device having a self-aligned channel stop region, and a method for fabricating the semiconductor device using a trim and etch is disclosed. The submicron semiconductor device includes a plurality of active regions separated by insulating regions. The method for fabricating the device includes depositing a nitride over a substrate and selectively covering the active regions with a mask, wherein the mask extends beyond boundaries of the active regions to narrow the width of the insulating regions. Thereafter, a channel stop implant is performed to form channel stops. The mask is then trimmed to the boundaries of the active regions after formation of the channel stops, followed by etching the nitride in exposed areas of the mask. Field oxide is then grown in the insulating regions, whereby the field oxide is self-aligned to the channel stops.

According to the present invention, enlarging the nitride mask to narrow the insulating regions for the channel stop implant effectively reduces the amount that the dopant that diffuses during the LOCOS process, which therefore allows the fabrication of smaller devices.

DETAILED DESCRIPTION

The present invention relates to a process for fabricating submicron semiconductor devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is a semiconductor device having a self-aligned channel stop region, and a method for fabricating the same using a trim and etch. The present invention will be described using the example of a CMOS device having a feature size of approximately 0.3 microns and less, but those with ordinary skill in the art will appreciate that the method and apparatus can be used for other types of devices.

Figure 1A:
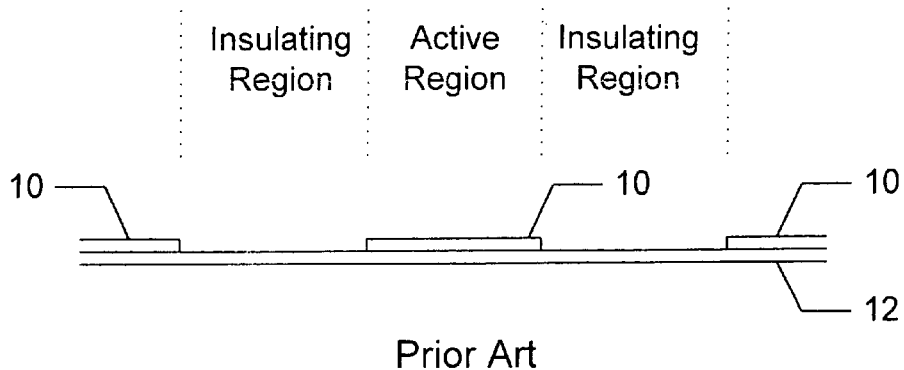
FIGS. 1A–1C are cross sectional views a substrate showing a process flow that might be used to fabricate a CMOS circuit having a feature of size of approximately 0.8 microns.
Figure 1B:
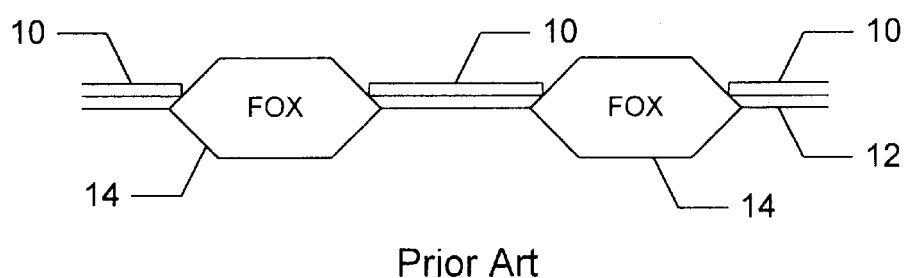
Figure 1C:
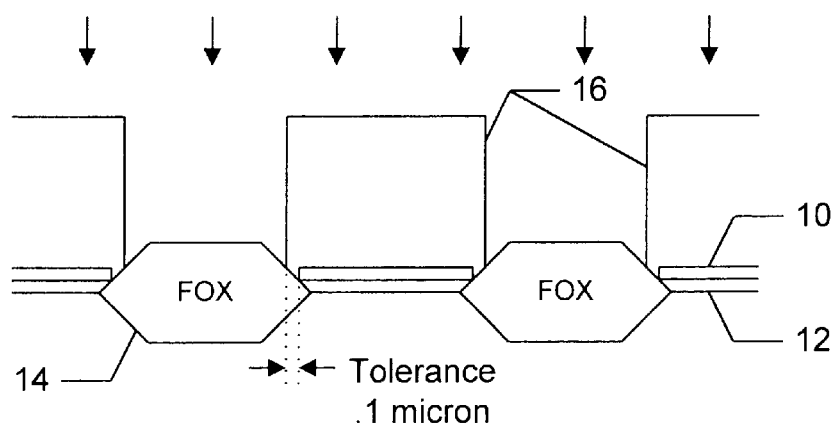
Figure 2A:
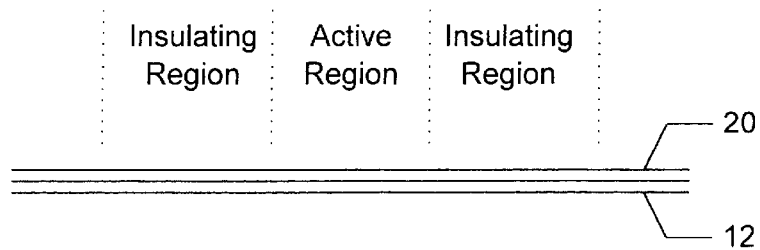
FIGS. 2A–2E are cross sectional views a substrate showing a process flow for fabricating a submicron semiconductor device having a self-aligned channel stop implant using a trim and etch in accordance with the present invention.

Referring now to FIGS. 2A–2D, cross sectional views of a substrate are shown illustrating a process flow for fabricating a submicron semiconductor device having a self-aligned channel stop implant using a trim and etch. The process begins by depositing a layer of nitride 20 over the substrate 12, as shown in FIG. 2A.

Figure 2B:
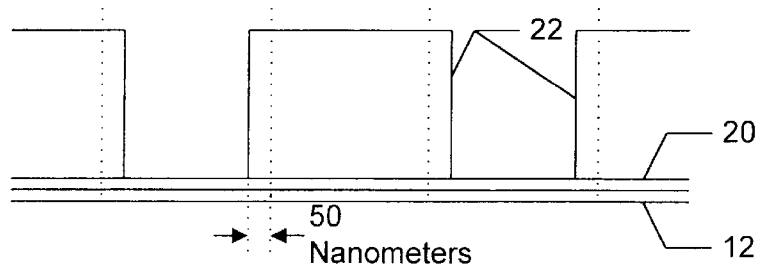

Next, photoresist is selectively patterned over the remaining nitride 20 to act as a mask 22, as shown in FIG. 2B. According to the present invention, the mask 22 extends beyond the boundaries of active regions by approximately 50 nanometers on each side to narrow the width of the insulating regions.

Figure 2C:
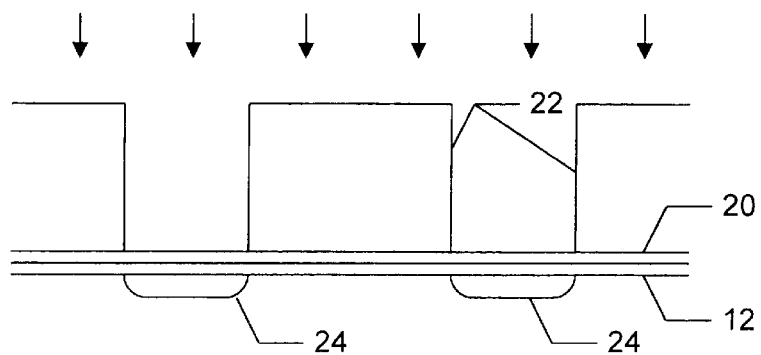

FIG. 2C shows that a channel stop implant is then performed to implant a dopant in the substrate 12 in exposed areas of the mask 22 to create channel stops 24 in the narrowed insulating regions.

After formation of the channel stops 24, a trim and etch step is performed where the mask 22 is trimmed back to the boundaries the active regions. Where the mask 22 extends the boundaries by 50 nanometers, then the mask 22 is trimmed by 50 nanometers on each side of the active regions.

In a preferred embodiment, the mask 22 is widened to over the active regions by the following process. First, a wet treatment comprising HF (0.1~2%) is applied to the mask 22 to remove a thin layer of passivant on the surface of the photoresist. The reason for performing a wet treatment is that the passivant cannot be etched using a dry process. After the wet treatment, the mask 22 may be etched back by a conventional dry etch process (HBr+O2 or N2+O2) followed by a standard silicon etch and a standard silicon-nitride etch.

Figure 2D:
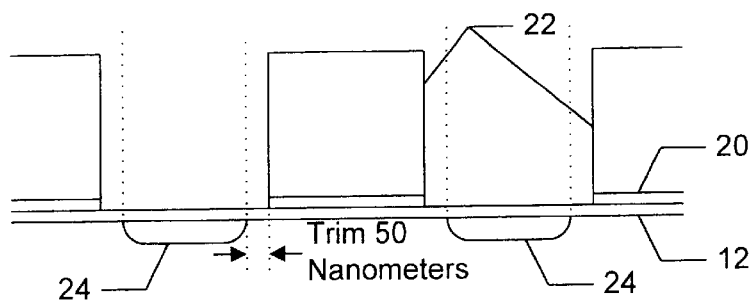
Figure 2E:
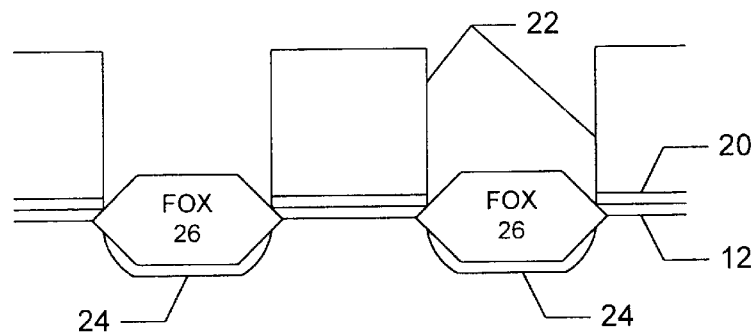

After the mask 22 has been trimmed, the nitride 20 is then etched in exposed areas of the mask 22 (insulating regions), as shown in FIG. 2D. The last step of the process is to perform a LOCOS process to grow field oxide 26 in the insulating regions, as show in FIG. 2E.

According to the present invention, enlarging the nitride mask 22 over the active areas and etching the nitride 20 later, enables the channel stop implant to be performed earlier in the process than conventional submicron techniques and ensures that the FOX regions 26 are self-aligned with the channel stops 24. Enlarging the nitride mask 22 to narrow the insulating regions for the channel stop implant effectively reduces the amount that the dopant that diffuses during the LOCOS process and therefore allows smaller devices. The present invention also eases mask tolerance limitations.

A submicron semiconductor device having a self-aligned channel stop region, and a method for fabricating the semiconductor device using a trim and etch has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A semiconductor device having a submicron feature size of less than approximately 0.3 microns, comprising:

a plurality of active regions; and insulating regions separating the active regions comprising field oxide and channel stops, wherein the insulating regions are formed by depositing a nitride over a substrate;

selectively covering the active regions with a mask, wherein the mask extends beyond boundaries of the active regions to narrow the width of the insulating regions, performing a channel stop implant to form channel stops, trimming the mask so that the mask extends to the boundaries of the active regions, etching the nitride in exposed areas of the mask, and growing the field oxide to create FOX regions, wherein the FOX regions are self-aligned with the channel stops due to enlarging the mask over the active areas for the channel stop implant, and thereby reducing an amount of dopant that diffuses toward the active regions.

2. The device as in claim 1 wherein the mask extends by approximately 50 nanometers on each side of the active regions.

3. The device as in claim 2 wherein after formation of the channel stops, the mask is trimmed by approximately 50 nanometers on each side of the active regions.

* * * * *